(12) United States Patent
Ota

(10) Patent No.: US 7,355,490 B2
(45) Date of Patent: Apr. 8, 2008

(54) RECEIVER HAVING NO TRACKING ERROR

(75) Inventor: Masahiko Ota, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 86 days.

(21) Appl. No.: 11/389,427

(22) Filed: Mar. 23, 2006

(65) Prior Publication Data

US 2006/0223475 A1    Oct. 5, 2006

(30) Foreign Application Priority Data

Mar. 31, 2005  (JP) ............................. 2005-102819

(51) Int. Cl.
  *H03B 5/18*    (2006.01)
  *H04B 1/06*    (2006.01)
(52) U.S. Cl. .................. 331/117 FE; 331/2; 331/16; 331/36 C; 331/DIG. 2; 455/260
(58) Field of Classification Search ................ 455/260; 331/2, 117 FE, 36 C, 16, DIG. 2
See application file for complete search history.

(56) References Cited

U.S. PATENT DOCUMENTS 5,648,744 A * 7/1997 Prakash et al. .............. 331/11
6,522,868 B1 * 2/2003 Stilwell ....................... 455/76
6,856,205 B1 * 2/2005 Groe et al. ................... 331/17
7,068,989 B2 * 6/2006 Yonekura ................... 455/260

FOREIGN PATENT DOCUMENTS

JP      6-21767      1/1994
JP      3106132      10/2004

* cited by examiner

*Primary Examiner*—Benny Lee
*Assistant Examiner*—Levi Gannon
(74) *Attorney, Agent, or Firm*—Brinks Hofer Gilson & Lione

(57) ABSTRACT

A receiver includes an up/down counter that controls turning on/off of individual switching units, and a count signal generator that compares a control voltage with a first reference voltage and a second reference voltage lower than the first reference voltage and outputs a count signal to the up/down counter. The count signal generator outputs a down count signal when the control voltage is higher than the first reference voltage, outputs an up count signal when the control voltage is lower than the second reference voltage, and stops the output of the up count signal and the down count signal and outputs a lock signal when the control voltage is between the first reference voltage and the second reference voltage. By the lock signal, a flow of a current in oscillating active elements stops.

2 Claims, 2 Drawing Sheets

| OUTPUT OF FIRST COMPARATOR | OUTPUT OF SECOND COMPARATOR | OUTPUT OF COUNTER CONTROL CIRCUIT |
| --- | --- | --- |
| H | L | DOWN COUNT SIGNAL |
| L | H | LOCK SIGNAL |
| L | L | UP COUNT SIGNAL |

RECEIVER HAVING NO TRACKING ERROR

BACKGROUND OF THE INVENTION

1. Field of the Invention

The present invention relates to a superheterodyne receiver, such as a television tuner or the like.

2. Description of the Related Art

A related art receiver, such as a television tuner, will be described with reference to FIG. 3. An input tuning circuit 2 is coupled to an input terminal 1 to which a television signal is input. The input tuning circuit 2 includes inductive elements 2a and 2b that are connected in parallel with each other, a capacitor 2c through which one end of the inductive element 2a is grounded, a varactor diode 2d, an anode of which is connected to the inductive element 2b, and a capacitor 2e through which a cathode of the varactor diode 2d is grounded. A connection point between the inductive element 2a and the capacitor 2c is connected to a ground through a resistor 3. In addition, the cathode of the varactor diode 2d is connected to a tuning voltage terminal 4. The input tuning circuit 2 is coupled to an RF amplifier 7 through a series circuit of a coupling varactor diode 5 and a coupling capacitor 6. An anode of the coupling varactor diode 5 is connected to the anode of the varactor diode 2d, and a cathode thereof is connected to the tuning voltage terminal 4.

A primary circuit of an interstage tuning circuit 8 coupled to an output of the RF amplifier 7 includes a varactor diode 8a, an inductive element 8b that is connected to an anode of the varactor diode 8a, and a capacitor 8c through which a cathode of the varactor diode 8a is grounded. A secondary circuit of the interstage tuning circuit 8 also includes a varactor diode 8d, an inductive element 8e that is connected to an anode of the varactor diode 8d, and a capacitor 8f through which a cathode of the varactor diode 8d is grounded. The two inductive elements 8b and 8e are connected in series to each other, and a connection point between the two inductive elements 8b and 8e is connected to one end of a coupling inductive element 8g. The other end of the inductive element 8g is grounded through a capacitor 8h. The cathodes of the two varactor diodes 8a and 8d are connected to the tuning voltage terminal 4. In addition, a connection point between the coupling inductive element 8g and the capacitor 8h is connected to the ground through a resistor 9.

The interstage tuning circuit 8 is coupled to a mixer 12 through a series circuit of a coupling varactor diode 10 and a capacitor 11. An anode of the coupling varactor diode 10 is connected to the anode of the varactor diode 8d, and a cathode thereof is connected to the tuning voltage terminal 4. A local oscillating signal is supplied from an oscillator 13 to the mixer 12. And then, a television signal output from the interstage tuning circuit 8 is converted into an intermediate frequency signal by the mixer 12. A resonating circuit 14 constituting the oscillator 13 includes a varactor diode 14a, a capacitor 14b through which a cathode of the varactor diode 14a is grounded, an inductive element 14c, one end of which is connected to an anode of the varactor diode 14a, and a capacitor 14d through which the other end of the inductive element 14c is grounded. The cathode of the varactor diode 14a is connected to the tuning voltage terminal 4. In addition, a connection point between the inductive element 14c and the capacitor 14d is connected to the ground through the resistor 15.

The voltage on the anode of the varactor diode 2d in the input tuning circuit 2, the voltage on the anode of each of the two varactor diodes 8a and 8d in the interstage tuning circuit 8, and the voltage on the anode of the varactor diode 14a in the resonating circuit 14 are switched by a transistor 16. An emitter of the transistor 16 is grounded, and a predetermined voltage is applied to a collector of the transistor 16 from a voltage stabilization circuit 17 through a protection resistor 18. To a base of the transistor 16, a switching voltage for turning on or off the transistor 16 is applied. And then, the connection point between the inductive element 2a and the capacitor 2c in the input tuning circuit 2 is connected to the collector of the transistor 16 through a resistor 19. Further, the connection point between the coupling inductive element 8g and the capacitor 8h in the interstage tuning circuit 8 is connected to the collector of the transistor 16 through a resistor 20. In addition, the connection point between the inductive element 14c and the capacitor 14d in the resonating circuit 14 is connected to the collector of the transistor 16 through a resistor 21.

Moreover, the oscillation frequency of the oscillator 13 is controlled by a PLL circuit 25 on the basis of channel selection data D, and, as a result of the control, a tuning voltage Vt is output from the PLL circuit 25 and is supplied to the tuning voltage terminal 4.

Next, according to the configuration described above, when a high-band television signal is received, the transistor 16 is turned on. If doing so, the anodes of the individual varactor diodes 2d, 8a, 8d, and 14a have a ground potential. In this state, the tuning voltage Vt is applied to the cathodes of the individual varactor diodes 2d, 5, 8a, 8d, 10, and 14a. In this case, when the tuning voltage falls and a low-band television signal is received, the tuning voltage is excessively lowered. For this reason, when the low-band television signal is received, the transistor 16 is turned off. If doing so, a voltage divided by the resistors 19 and 3 is applied to the anode of the varactor diode 2d, a voltage divided by the resistors 20 and 9 is applied to the anodes of the varactor diodes 8a and 8d, and a voltage divided by the resistors 21 and 15 is applied to the anode of the varactor diode 14a. Accordingly, the tuning voltage to be applied to the cathodes of the individual varactor diodes is increased, and thus a receiving frequency range can be expanded, without using an unstable low tuning voltage (for example, see Japanese Utility Model No. 3106132 (FIG. 1)).

In a related art transceiver, the same tuning voltage is applied to the varactor diodes 2d, 8a, and 8d in the tuning circuit and the varactor diode 4a in the oscillator. Accordingly, even when the resistance values of the resistors 19, 20, and 21 and the resistance values of the resistors 3, 9, and 15 are independently set, in a wide frequency range, a tuning frequency and a local oscillation frequency are rarely changed at the same frequency gap when the tuning voltage is changed. As a result, a so-called tracking error occurs.

SUMMARY OF THE INVENTION

It is an object of the invention to provide a receiver which can constantly maintain a predetermined gap between a tuning frequency of a tuning circuit and a local oscillation frequency of an oscillator over a wide receiving frequency range, thereby preventing a tracking error.

According to an aspect of the invention, a receiver includes a tuning circuit that has a variable capacitive unit and an inductive element, and is capable of being tuned to a frequency of a received signal, the variable capacitive unit having a plurality of capacitive elements and switching units that connect the individual capacitive elements to the inductive element in parallel, a mixer that frequency-converts the received signal, a local oscillator that supplies a local oscillating signal to the mixer, a first PLL circuit that controls the local oscillator to oscillate at a frequency corresponding to the frequency of the received signal, an oscillating active element that constitutes an oscillating circuit together with the tuning circuit, a second PLL circuit that controls the oscillating circuit to output a control voltage for setting a capacitance value of the variable capacitive unit such that an oscillation frequency of the oscillating circuit matches with the frequency of the received signal, an up/down counter that controls turning on/off of the switching units by multiple-bit output data, and a count signal generator that compares the control voltage with a first reference voltage and a second reference voltage lower than the first reference voltage, and outputs an up count signal or a down count signal to the up/down counter. Here, the count signal generator outputs the down count signal when the control voltage is higher than the first reference voltage, outputs the up count signal when the control voltage is lower than the second reference voltage, and stops the output of the up count signal and the down count signal and outputs a lock signal when the control voltage is between the first reference voltage and the second reference voltage. By the lock signal, a flow of a current in the oscillating active element stops.

Further, according to a second aspect of the invention, the capacitance values of the capacitive elements may be set to be different from one another by setting, with respect to one capacitive element having a minimum capacitance value, the capacitance values of other capacitive elements to be $2^N$ times as much as the minimum capacitance value.

Further, according to a third aspect of the invention, the count signal generator may have a first comparator that compares the control voltage with the first reference voltage and outputs a high logical level or a low logical level, a second comparator that compares the control voltage with the second reference voltage and outputs a high logical level or a low logical level, and a counter control circuit that outputs one of the up count signal, the down count signal, and the lock signal on the basis of the logical levels output from the first comparator and the second comparator.

Further, according to a fourth aspect of the invention, the tuning circuit is a double-tuning circuit, and each of a primary tuning circuit and a secondary tuning circuit of the double-tuning circuit has the variable capacitive unit and the inductive element. The oscillating active element has two three-terminal amplifying elements, each having an input terminal, an output terminal, and a reference terminal. The primary tuning circuit and the secondary tuning circuit are connected in series to each other and are connected between an output terminal of one of the amplifying elements and an output terminal of the other amplifying element, and a connection point between the primary tuning circuit and the secondary tuning circuit is grounded in a high-frequency manner. An input terminal of one of the amplifying elements is connected to the output terminal of the other amplifying element, and the output terminal of one of the amplifying elements is connected to an input terminal of the other amplifying element. A power supply voltage is applied to the output terminals of the individual amplifying elements through the individual inductive elements, and a constant current source is connected to the reference terminals of the amplifying elements. A flow of a current in the constant current source stops by the lock signal when the control voltage is between the first reference voltage and the second reference voltage.

DESCRIPTION OF THE PREFERRED EMBODIMENT

Figure 1:
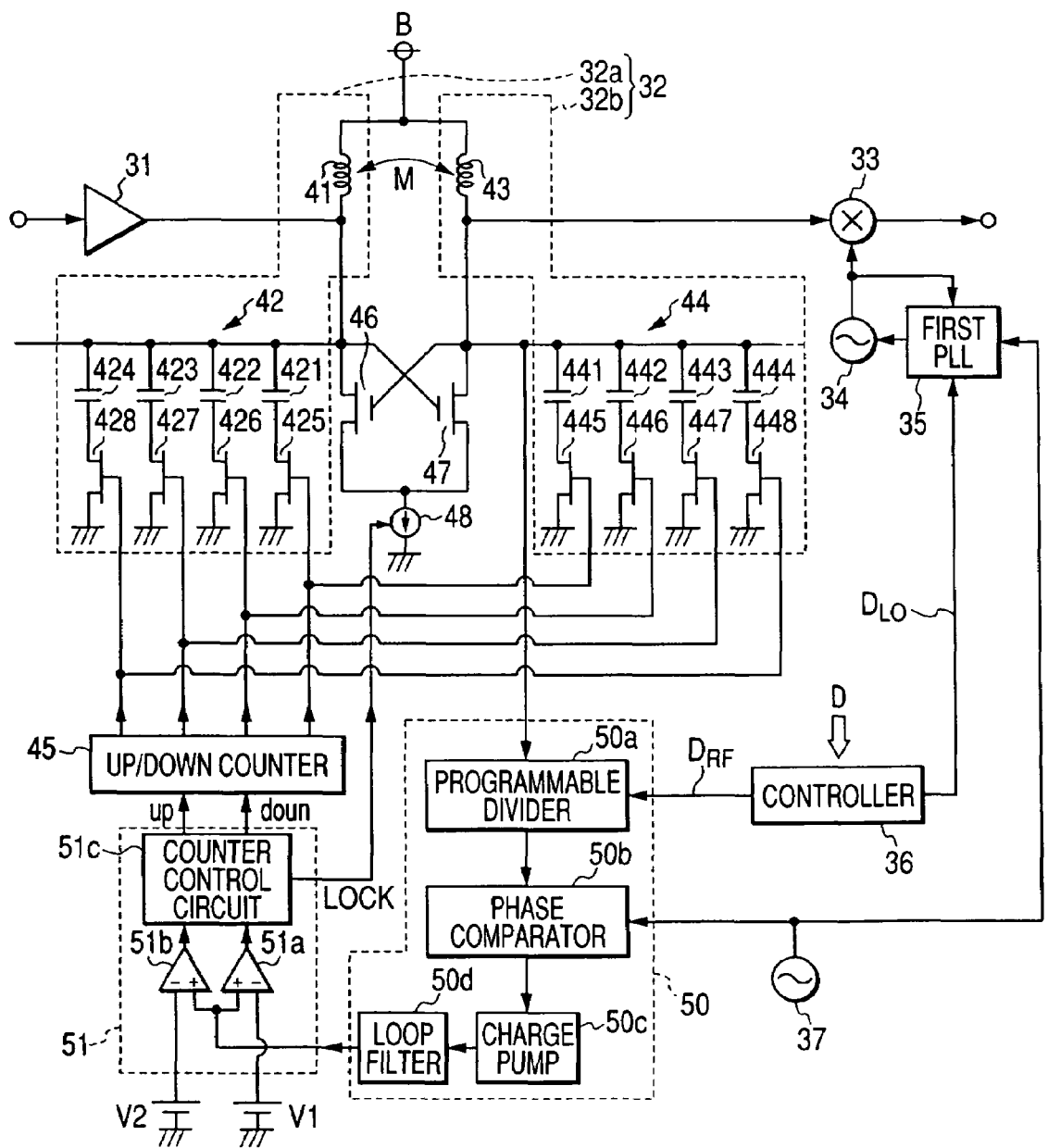
FIG. 1 is a circuit diagram showing a configuration of a receiver according to the invention.

Hereinafter, a receiver according to the invention will be described by way of a television tuner. FIG. 1 shows the configuration of the receiver. An input tuning circuit is provided on an upstream side of a high frequency amplifier 31 but is not shown in FIG. 1. A received signal amplified by the high frequency amplifier 31 is input to a frequency-converting mixer 33 through an interstage tuning circuit 32. A local oscillating signal is supplied from a local oscillator 34 to the mixer 33. The local oscillator 34 is controlled by a first PLL circuit 35 such that the local oscillating signal has a frequency corresponding to a frequency of the received signal (for example, a frequency higher than a received frequency by an intermediate frequency). The frequency of the local oscillating signal is set by using local oscillation frequency data $D_{LO}$ supplied from a channel-selecting controller 36. Moreover, a reference signal is supplied from a reference oscillator 37 to the first PLL circuit 35.

The interstage tuning circuit 32 is a double-tuning circuit. A primary tuning circuit 32a has an inductive element 41 and a capacitive unit 42. One end of the inductive element 41 is connected to a power supply B, and the capacitive unit 42 is connected between the other end of the inductive element 41 and a ground. The capacitive unit 42 has a plurality of capacitive elements 421 to 424 and switching units 425 to 428 that are correspondingly connected to the capacitive elements 421 to 424 in series. Each of the switching units 425 to 428 is a three-terminal switching element, such as a FET or a transistor, and a source (or emitter) thereof is grounded. The capacitive element 421 has a minimum capacitance value C, and the capacitance values of the capacitive elements 422 to 424 are 2C, 4C, and 8C, respectively. That is, the capacitance values of the capacitive elements 422 to 424 are increased to be $2^N$ times as much as the minimum capacitance value. When the switching units 425 to 428 are turned on, the capacitive elements 421 to 424 corresponding to the switching units 425 to 428 are connected to the inductive element 41 in parallel in a high-frequency manner.

Similarly, a secondary tuning circuit 32b has an inductive element 43 and a capacitive unit 44. One end of the inductive element 43 is connected to the power supply B, and the capacitive unit 44 is connected between the other end of the inductive element 43 and the ground. The capacitive unit 44 has a plurality of capacitive elements 441 to 444 and switching units 445 to 448 that are correspondingly connected to the capacitive elements 441 to 444 in series. Each of the switching units 445 to 448 is a FET, and a source thereof is grounded. The capacitive element 441 has a minimum capacitance value C, and the capacitance values of the capacitive elements 442 to 444 are 2C, 4C, and 8C, respectively. That is, the capacitance values of the capacitive elements 442 to 444 are increased to be $2^N$ times as much as the minimum capacitance value. When the switching units 445 to 448 are turned on, the capacitive elements 441 to 444 corresponding to the switching units 445 to 448 are connected to the inductive element 43 in parallel in a high-frequency manner. In addition, the inductive element 41 of the primary tuning circuit 32a (hereinafter, referred to as 'primary inductive element') and the inductive element 43 of the secondary tuning circuit 32b (hereinafter, referred to as 'secondary inductive element') are coupled to each other.

As such, each of the capacitive units 42 and can have a capacitance value corresponding to an integer multiple of the minimum capacitance value. In addition, by setting the minimum capacitance value as small as possible so as to increase the number of capacitive elements, a tuning frequency can be accurately set and a tuning frequency range can be expanded.

Each of the switching units 425 to 428 and 445 to 448 is turned on by a voltage applied to its control terminal (gate or base), and the control terminals of the switching units connected to the capacitive elements having the same capacitance value are connected to each other. That is, the control terminals of the switching units 425 and 445 are connected to each other. Similarly, the control terminals of the switching units 426 and 446 are connected to each other, the control terminals of the switching units 427 and 447 are connected to each other, and the control terminals of the switching units 428 and 448 are connected to each other. In addition, the control terminals connected to each other are connected to an output terminal of an up/down counter 45. The up/down counter 45 has the same number of output bits as the number of kinds of capacitive elements.

A first oscillating active element 46 is provided between the ground and a connection point between the primary inductive element 41 and the capacitive unit 42, and a second oscillating active element 47 is provided between the ground and a connection point between the secondary inductive element 43 and the capacitive unit 44. Each of the first oscillating active element 46 and the second oscillating active element 47 is a three-terminal amplifying element, such as a FET or a transistor. And then, an output terminal of the first oscillating active element 46 (a drain in case of a FET or a collector in case of a transistor) is connected to the connection point between the primary inductive element 41 and the capacitive unit 42, and an output terminal of the second oscillating active element 47 is connected to the connection point between the secondary inductive element 43 and the capacitive unit 44. The output terminal of the first oscillating active element 46 is connected to an input terminal of the second oscillating active element 47 (a gate in case of a FET or a base in case of a transistor), and the output terminal of the second oscillating active element 47 is connected to an input terminal of the first oscillating active element 46. In addition, a constant current source 48 is provided between a reference terminal of each of the oscillating active elements 46 and 47 (a source in case of a FET or a base in case of a transistor) and the ground. A current mirror circuit is used as the constant current source 48.

According to the configuration described above, in a state of being connected in series through the ground, the primary tuning circuit 32a and the secondary tuning circuit 32b are connected between the output terminal of the first oscillating active element 46 and the output terminal of the second oscillating active element 47. Accordingly, the oscillating active elements 46 and 47 and the tuning circuits 32a and 32b constitute a parallel oscillating circuit.

The oscillating circuit is controlled by a second PLL circuit 50 such that an oscillation frequency matches with a frequency of a signal to be received. The second PLL circuit 50 has a programmable divider 50a, a phase comparator 50b, a charge pump 50c, and a loop filter 50d. To the programmable divider 50a, an oscillating signal is input from the oscillating circuit and received frequency data $D_{RF}$ for setting the frequency of the signal to be received is input from the controller 36. The oscillating signal divided by the programmable divider 50a is input to the phase comparator 50b. In the phase comparator 50b, a phase of a reference signal input from the reference oscillator 37 and a phase of the divided oscillating signal are compared with each other, and then an error signal, which is the phase difference, is input to the loop filter 50d through the charge pump 50c to be then converted into a direct-current (DC) voltage. The DC voltage serves as a control voltage for setting the capacitance values of the capacitive units 42 and 44.

The control voltage is applied to a count signal generator 51 for supplying an up count signal or a down count signal to the up/down counter 45. The count signal generator 51 has two comparators 51a and 51b, from which logical levels are output, and a counter control circuit 51c, and the control voltage is input to the first and second comparators 51a and 51b. An output of the first comparator 51a and an output of the second comparator 51b are input to the counter control circuit 51c. A first reference voltage V1 is applied to the first comparator 51a, and a second reference voltage V2 is applied to the second comparator 51b. The second reference voltage V2 is slightly lower than the first reference voltage V1. Accordingly, when the control voltage is higher than the first reference voltage V1, the outputs of the first and second comparators 51a and 51b all become the high levels (H), and when the control voltage is between the first reference voltage V1 and the second reference voltage V2, the output of the first comparator 51a becomes the low level (L) and the output of the second comparator 51b becomes the high level (H). In addition, when the control voltage is lower than the second reference voltage, the outputs of the first and second comparators 51a and 51b all become the low levels (L).

Figures 2, 3:
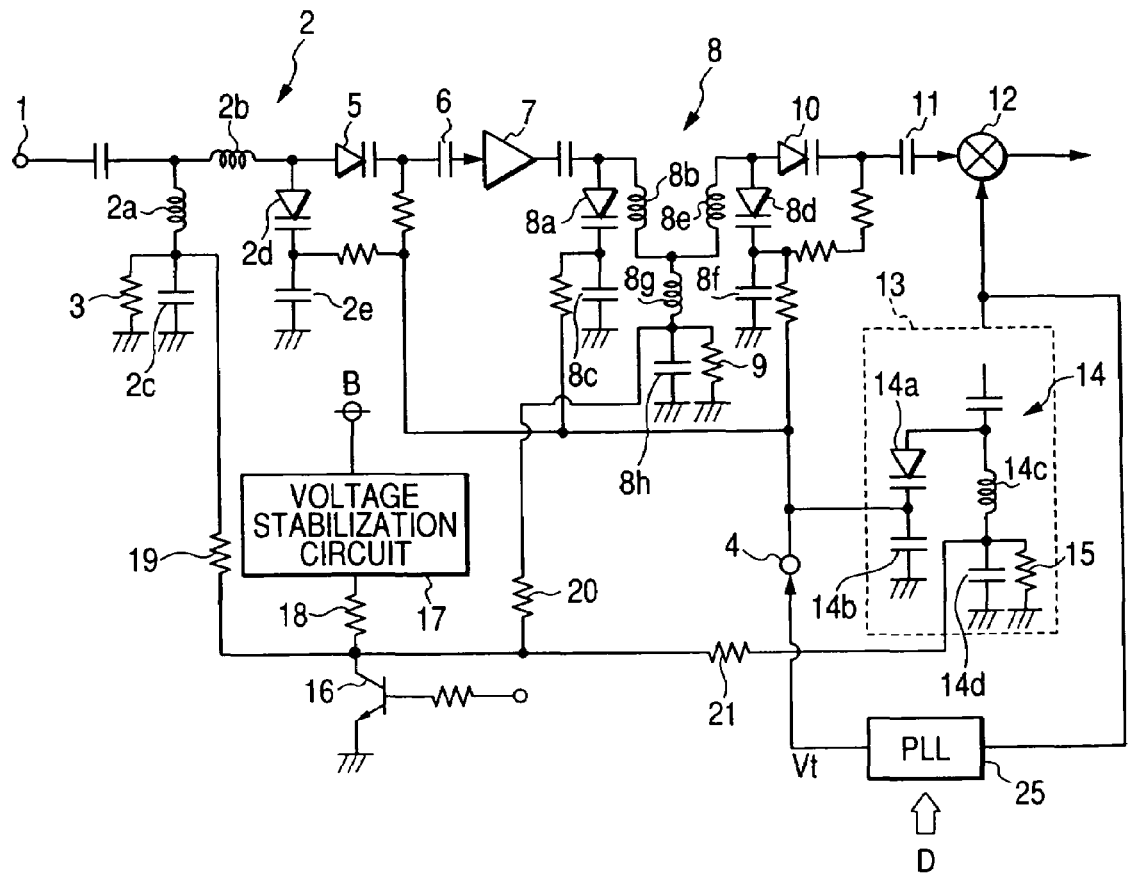
FIG. 2 is a truth value table illustrating an operation of a count signal generator in the receiver according to the invention.
FIG. 3 is a circuit diagram showing a configuration of a receiver according to the related art.

To the counter control circuit 51c, a clock signal (CLCK) is input. In this state, if the logical levels are input from the first and second comparators 51a and 51b, according to a truth value table shown in FIG. 2, the up count signal and the down count signal in synchronization with the clock signal are correspondingly output from the output terminals of the counter control circuit 51c. Further, a high-level lock signal is output from a third output terminal, regardless of the clock signal. That is, when the output of the first comparator 51a and the output of the second comparator 51b all are in the high levels, and, when the output of the first comparator 51a is in the low level and the output of the second comparator 51b is in the high level, only the lock signal is output. In addition, when the output of the first comparator 51a and the output of the second comparator 51b all are in the low levels, only the up count signal is output.

The up/down counter 45 performs an up count operation or a down count operation on the basis of the up count signal or the down count signal, and the output terminal of the up/down counter 45 is changed to a high level or a low level. In addition, a switching unit connected to a high-level output terminal of the up/down counter 45 is turned on, the capacitive element corresponding to the switching unit is connected to the inductive elements 41 and 43 in parallel, and the oscillating circuit substantially oscillates at a parallel resonance frequency. In this case, the up/down counter 45 continuously performs the up count operation in a range in which the oscillation frequency is higher than the frequency of the signal to be received. Further, the up/down counter 45 continuously performs the down count operation in a range in which the oscillation frequency is lower than the frequency of the signal to be received. In addition, when the oscillation frequency substantially matches with the frequency of the signal to be received, the control voltage becomes a voltage between the first reference voltage V1 and the second reference voltage V2, and thus the counter control circuit 51c outputs the lock signal. By preparing a switching element (not shown) which is turned on by the lock signal and is connected to a collector of a transistor (or a drain in case of a FET) on a constant current input side of a current mirror circuit (not shown) constituting the constant current source 48, it is possible to stop a flow of a constant current.

Accordingly, the operations of the first and second oscillating active elements 46 and 47 stop, and thus the up count signal and the down count signal are not input to the up/down counter 45, such that output data (multiple-bit data) of the up/down counter 45 maintains a value immediately before the operations of the first and second oscillating active elements 46 and 47 stop. As a result, the tuning circuits 32a and 32b remain tuned to the frequency of the signal to be received, and the signal to be received is selected by the tuning circuits 32a and 32b to be then input to the mixer 33. And then, the signal input to the mixer 33 is frequency-converted into an intermediate frequency signal.

As described above, the tuning circuits 32a and 32b are not controlled by the first PLL circuit 35 that controls the local oscillator 34. Specifically, the tuning circuits 32a and 32b are controlled by the second PLL circuit 50 such that the oscillation frequency matches with the frequency of the signal to be received. Accordingly, a frequency gap between the local oscillation frequency and the tuning frequency can be constantly maintained constant, and thus a so-called tracking error can be prevented.

Moreover, even thought the invention has been described about the control of the tuning frequency in the interstage tuning circuit, the invention can be applied to other tuning circuits, for example, an input tuning circuit.

According to the first aspect of the invention, the variable capacitive unit has the plurality of capacitive elements and the switching units that connect the individual capacitive elements to the inductive element in parallel. Further, the oscillating active element that constitutes the oscillating circuit together with the tuning circuit, the second PLL circuit that controls the oscillating circuit to output the control voltage for setting the capacitance value of the variable capacitive unit such that the oscillation frequency of the oscillating circuit matches with the frequency of the received signal, the up/down counter that controls turning on/off of the switching units by multiple-bit output data, and the count signal generator that compares the control voltage with the first reference voltage and the second reference voltage lower than the first reference voltage, and outputs the up count signal or the down count signal to the up/down counter are provided. Here, the count signal generator outputs the down count signal when the control voltage is higher than the first reference voltage, outputs the up count signal when the control voltage is lower than the second reference voltage, and stops the output of the up count signal and the down count signal and outputs the lock signal when the control voltage is between the first reference voltage and the second reference voltage. By the lock signal, the flow of the current in the oscillating active element stops. Therefore, the tuning circuit matches with the frequency of the received signal. As a result, a tracking error does not occur between the tuning frequency of the tuning circuit and the oscillation frequency of the local oscillator.

According to the second aspect of the invention, the capacitance values of the capacitive elements are set to be different from one another by setting, with respect to one capacitive element having a minimum capacitance value, the capacitance values of other capacitive elements to be $2^N$ times as much as the minimum capacitance value. Therefore, the capacitance value of the capacitive unit can be closely set.

According to the third aspect of the invention, the count signal generator has the first comparator that compares the control voltage with the first reference voltage and outputs the high logical level or the low logical level, the second comparator that compares the control voltage with the second reference voltage and outputs the high logical level or the low logical level, and the counter control circuit that outputs one of the up count signal, the down count signal, and the lock signal on the basis of the logical levels output from the first comparator and the second comparator. Therefore, the capacitance value of the capacitive unit can be maintained when the tuning circuit matches with the frequency of the received signal.

According to the fourth aspect of the invention, the tuning circuit is the double-tuning circuit, and each of the primary tuning circuit and the secondary tuning circuit of the double-tuning circuit has the variable capacitive unit and the inductive element. The oscillating active element has the two three-terminal amplifying elements, each having the input terminal, the output terminal, and the reference terminal. The primary tuning circuit and the secondary tuning circuit are connected in series to each other and are connected between the output terminal of one of the amplifying elements and the output terminal of the other amplifying element. The connection point between the primary tuning circuit and the secondary tuning circuit is grounded in a high-frequency manner. The input terminal of one of the amplifying elements is connected to the output terminal of the other amplifying element, and the output terminal of one of the amplifying elements is connected to an input terminal of the other amplifying element. The power supply voltage is applied to the output terminals of the individual amplifying elements through the individual inductive elements, and the constant current source is connected to the reference terminals of the amplifying elements. The flow of the current in the constant current source stops by the lock signal when the control voltage is between the first reference voltage and the second reference voltage. Therefore, if the tuning circuit matches with the frequency of the received signal, the oscillating active element does not have influence on the tuning circuit.

The invention claimed is:

1. A receiver comprising:
    a tuning circuit that has a variable capacitive unit and an inductive element, and is capable of being tuned to a frequency of a received signal, the variable capacitive unit having a plurality of capacitive elements and switching units that connect the individual capacitive elements to the inductive element in parallel;
    a mixer that frequency-converts the received signal;
    a local oscillator that supplies a local oscillating signal to the mixer;
    a first PLL circuit that controls the local oscillator to oscillate at a frequency corresponding to the frequency of the received signal;
    an oscillating active element that constitutes an oscillating circuit together with the tuning circuit;
    a second PLL circuit that controls the oscillating circuit to output a control voltage for setting a capacitance value of the variable capacitive unit such that an oscillation frequency of the oscillating circuit matches with the frequency of the received signal;

an up/down counter that controls turning on/off of the switching units by multiple-bit output data; and a count signal generator that compares the control voltage with a first reference voltage and a second reference voltage lower than the first reference voltage, and outputs an up count signal or a down count signal to the up/down counter, wherein the count signal generator outputs the down count signal when the control voltage is higher than the first reference voltage, outputs the up count signal when the control voltage is lower than the second reference voltage, and stops the output of the up count signal and the down count signal and outputs a lock signal when the control voltage is between the first reference voltage and the second reference voltage, and by the lock signal, a flow of a current in the oscillating active element stops; and wherein the count signal generator further comprises:
    a first comparator that compares the control voltage with the first reference voltage and outputs a high logical level or a low logical level;
    a second comparator that compares the control voltage with the second reference voltage and outputs a high logical level or a low logical level; and
    a counter control circuit that outputs one of the up count signal, the down count signal, and the lock signal on the basis of the logical levels output from the first comparator and the second comparator, and wherein the tuning circuit is a double-tuning circuit,
    each of a primary tuning circuit and a secondary tuning circuit of the double-tuning circuit has the variable capacitive unit and the inductive element, the oscillating active element has two three-terminal amplifying elements, each having an input terminal, an output terminal, and a reference terminal, the primary tuning circuit and the secondary tuning circuit are connected in series to each other and are connected between an output terminal of one of the amplifying elements and an output terminal of the other amplifying element, a connection point between the primary tuning circuit and the secondary tuning circuit is grounded in a high-frequency manner, an input terminal of one of the amplifying elements is connected to the output terminal of the other amplifying element, and the output terminal of one of the amplifying elements is connected to an input terminal of the other amplifying element, a power supply voltage is applied to the output terminals of the individual amplifying elements through the individual inductive elements, and a constant current source is connected to the reference terminals of the amplifying elements, and a flow of a current in the constant current source stops by the lock signal when the control voltage is between the first reference voltage and the second reference voltage.

2. The receiver according to claim 1, wherein the capacitance values of the capacitive elements are set to be different from one another by setting, with respect to one capacitive element having a minimum capacitance value, the capacitance values of other capacitive elements to be $2^N$ times as much as the minimum capacitance value.

* * * * *

UNITED STATES PATENT AND TRADEMARK OFFICE
CERTIFICATE OF CORRECTION

PATENT NO. : 7,355,490 B2  Page 1 of 1
APPLICATION NO. : 11/389427
DATED : April 8, 2008
INVENTOR(S) : Masahiko Ota It is certified that error appears in the above-identified patent and that said Letters Patent is hereby corrected as shown below:

Column 10, claim 1, line 11, before "manner," delete "freguency" and substitute --frequency-- in its place.

Signed and Sealed this

Twelfth Day of August, 2008

JON W. DUDAS
*Director of the United States Patent and Trademark Office*